(12) United States Patent
Ma et al.

(10) Patent No.: US 10,019,923 B2
(45) Date of Patent: Jul. 10, 2018

(54) SHIFT REGISTER AND DRIVING METHOD THEREOF, GATE DRIVING CIRCUIT, DISPLAY APPARATUS

(71) Applicant: BOE TECHNOLOGY GROUP CO., LTD., Beijing (CN)

(72) Inventors: Zhanjie Ma, Beijing (CN); Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 145 days.

(21) Appl. No.: 15/021,990

(22) PCT Filed: Sep. 25, 2015

(86) PCT No.: PCT/CN2015/090714
§ 371 (c)(1),
(2) Date: Mar. 15, 2016

(87) PCT Pub. No.: WO2016/123991
PCT Pub. Date: Aug. 11, 2016

(65) Prior Publication Data
US 2016/0225341 A1 Aug. 4, 2016

(30) Foreign Application Priority Data
Feb. 3, 2015 (CN) .......................... 2015 1 0055859

(51) Int. Cl.
*G11C 19/00* (2006.01)
*G09G 3/20* (2006.01)
*G11C 19/28* (2006.01)

(52) U.S. Cl.
CPC ....... *G09G 3/20* (2013.01); *G09G 2300/0426* (2013.01); *G09G 2310/0286* (2013.01);
(Continued)

(58) Field of Classification Search
None
See application file for complete search history.

(56) References Cited

U.S. PATENT DOCUMENTS

| 8,952,943 B2* | 2/2015 | Chung | G09G 3/3266 345/204 |
| 8,988,406 B2* | 3/2015 | Chung | G09G 3/3266 345/208 |

(Continued)

FOREIGN PATENT DOCUMENTS

| CN | 103000155 A | 3/2013 |
| CN | 103280200 A | 9/2013 |
| CN | 104299595 A | 1/2015 |

OTHER PUBLICATIONS

Office Action dated Jul. 6, 2016.
Partial Supplementary European Search Report dated May 25, 2018.

*Primary Examiner* — Tuan T Lam
(74) *Attorney, Agent, or Firm* — Dilworth & Barrese, LLP.; Michael J. Musella, Esq.

(57) ABSTRACT

A shift register and its driving method, a gate driving circuit, and a display apparatus, the shift register includes an input module (1), an output module (2) and an output control module (3); the output module (2) includes a first output unit (21) and a second output unit (22); and the output control module (3) comprises a first control unit (31) and a second control unit (32), the first control unit (31) controls the level of the first node (P), and the second control unit (32) controls the level of the second node (Q). The technical solutions of the present disclosure can diminish influence of the changing of the clock signal associated with the output module on the output signal, and improve the output effect of the shift register.

16 Claims, 5 Drawing Sheets

(52) U.S. Cl.
CPC ... *G09G 2310/067* (2013.01); *G09G 2310/08* (2013.01); *G11C 19/28* (2013.01)

(56) References Cited

U.S. PATENT DOCUMENTS

| | | | |
|---|---|---|---|
| 9,318,055 B2* | 4/2016 | Kim | G09G 3/3266 |
| 9,472,303 B2* | 10/2016 | Ma | G11C 19/28 |
| 2005/0185752 A1 | 8/2005 | Sasaki et al. | |
| 2006/0044247 A1* | 3/2006 | Jang | G09G 3/3674 345/98 |
| 2007/0040771 A1* | 2/2007 | Chung | G11C 19/00 345/76 |
| 2010/0177087 A1 | 7/2010 | Han | |
| 2013/0002306 A1* | 1/2013 | Chung | G09G 3/3266 327/108 |
| 2013/0127805 A1 | 5/2013 | Chung | |
| 2013/0266113 A1* | 10/2013 | Tsuge | H03K 3/00 377/64 |
| 2016/0155052 A1* | 6/2016 | Kozloski | G06Q 10/10 706/12 |
| 2016/0189626 A1* | 6/2016 | Sun | G09G 3/3266 345/212 |
| 2016/0293090 A1* | 10/2016 | Long | G09G 3/2092 |
| 2017/0193961 A1* | 7/2017 | Wang | G09G 5/003 |

\* cited by examiner

SHIFT REGISTER AND DRIVING METHOD THEREOF, GATE DRIVING CIRCUIT, DISPLAY APPARATUS

TECHNICAL FIELD OF THE DISCLOSURE

The present disclosure relates to the field of display technologies, in particular to a shift register and its driving method, a gate driving circuit, and a display apparatus.

BACKGROUND

It is required for a display apparatus to comprise a gate driving circuit so as to realize a normal display. Specifically, the gate driving circuit comprises multiple stages of shift registers in a cascade connection.

Particularly, a structure of a shift register is illustrated in FIG. 1. The shift register comprises an input module, an output module and an output control module. The input module comprises a transistor M1, the output module comprises transistors M2 and M3, and the output control module comprises transistors M4, M5, C1 and a capacitor C2, wherein M1-M5 are all PMOSFETs which are turned on by a low level. The timing sequence of the shift register in an operational process is illustrated in FIG. 2. At period t1, a start signal input from a start signal input terminal STV and a first clock signal input from a first clock signal input terminal CK1 are low level signals, and a second clock signal input from a second clock signal input terminal CK2 is a high level signal. At this time, transistors M1, M2, M3, M4 and M5 are all turned on, and the signal output terminal Output outputs a high level (an inactive signal). At period t2, the start signal input from the start signal input terminal STV and the first clock signal input from the first clock signal input terminal CK1 are high level signals, and the second clock signal input from the second clock signal input terminal CK2 is a low level signal, such that transistors M1, M4 and M5 are turned off. Transistors M2 and M3 are turned on due to the effect of C2 and C1, and the signal output terminal Output outputs a low level (an active signal).

The inventor(s) found that, when the second clock signal input from the second clock signal input terminal CK2 varies, the signal on the gate of transistor M2 would be affected by the coupling capacitance formed between the gate and the drain of transistor M2, so that the output signal output by the output terminal Output is affected, thus deteriorating the output signal and affecting the output effect of the shift register.

SUMMARY

Embodiments of the present disclosure provide a shift register and driving method thereof, a gate driving circuit, and display apparatus, which can reduce the influence of the variation of the clock signal associated with the output module on the output signal, and improve the output effect of the shift register.

According to a first aspect, an embodiment of the present disclosure provides a shift register comprising an input module, an output module and an output control module;

the input module is configured to control a signal transmission between a start signal input terminal and a first node;

the output module is configured to control a signal output at a signal output terminal, wherein the output module comprises a first output unit and a second output unit; the first output unit is connected to the first node, the first node is configured to control the first output unit, and the first output unit is configured to control a signal transmission between a second clock signal input terminal and the signal output terminal; the second output unit is connected to a second node, the second node is configured to control the second output unit, and the second output unit is configured to control a signal transmission between a first level signal input terminal and the signal output terminal; and the output control module comprises a first control unit and a second control unit, wherein the first control unit is configured to control the level at the first node, and the second control unit is configured to control the level at the second node.

Optionally, the input module comprises a first TFT having a gate connected to the first clock signal input terminal, a first electrode connected to the start signal input terminal and a second electrode connected to the first node.

Optionally, the first output unit comprises a second TFT having a gate connected to the first node, a first electrode connected to the signal output terminal and a second electrode connected to the second clock signal input terminal.

Optionally, the second output unit comprises a third TFT having a gate connected to the second node, a first electrode connected to the first level signal input terminal and a second electrode connected to the signal output terminal.

Optionally, the first control unit comprises a fourth TFT, a fifth TFT, a sixth TFT, a seventh TFT, an eighth TFT, a first capacitor and a second capacitor;

a gate of the fourth TFT is connected to the first node, a first electrode of the fourth TFT is connected to a third node, and a second electrode of the fourth TFT is connected to the first level signal input terminal;

a gate of the fifth TFT is connected to a third clock signal input terminal, a first electrode of the fifth TFT is connected to the third node, and a second electrode of the fifth TFT is connected to the second level signal input terminal;

a gate of the sixth TFT is connected to the third node, a first electrode of the sixth TFT is connected to a second electrode of the seventh TFT, and a second electrode of the sixth TFT is connected to the first level signal input terminal;

a gate of the seventh TFT is connected to the second clock signal input terminal, a first electrode of the seventh TFT is connected to the first node, and the second electrode of the seventh TFT is connected to the first electrode of the sixth TFT;

a gate of the eighth TFT is connected to the third clock signal input terminal, a first electrode of the eighth TFT is connected to the first level signal input terminal, and a second electrode of the eighth TFT is connected to the first node;

one terminal of the first capacitor is connected to the signal output terminal, and the other terminal of the first capacitor is connected to the first node; and one terminal of the second capacitor is connected to the third node, and the other terminal of the second capacitor is connected to the first level signal input terminal.

Optionally, the second control unit comprises a ninth TFT, a tenth TFT and a third capacitor;

wherein a gate of the ninth TFT is connected to the first node, a first electrode of the ninth TFT is connected to the start signal input terminal, a second electrode of the ninth TFT is connected to the second node;

a gate of the tenth TFT is connected to the third clock signal input terminal, a first electrode of the tenth TFT is connected to the second node, a second electrode of the tenth TFT is connected to the second level signal input terminal; and one terminal of the third capacitor is connected to the second node, and the other terminal of the third capacitor is connected to the first level signal input terminal.

Optionally, In a case in which the TFTs are of P type, the first level signal input terminal inputs a high level, and the second level signal input terminal inputs a low level; the first electrode is a source, and the second electrode is a drain; In a case in which the TFTs are of N type, the first level signal input terminal inputs a low level, and the second level signal input terminal inputs a high level; the first electrode is a drain, and the second electrode is a source.

An embodiment of the present disclosure provides a shift register comprising an input module, an output module and an output control module, wherein the input module controls a signal transmission between a start signal input terminal and a first node; the output module controls signal output at a signal output terminal; the output module comprises a first output unit and a second output unit, wherein the first output unit is connected to the first node, and the first node controls a signal transmission between a second clock signal input terminal and the signal output terminal; the second output unit is connected to a second node, and the second node controls a signal transmission between a first level signal input terminal and the signal output terminal; and the output control module comprises a first control unit and a second control unit, wherein the first control unit controls the level at the first node, and the second control unit controls the level at the second node. Therefore, it is possible to stabilize the levels at the first node and the second node, diminish influence of the changing of the clock signal associated with the output module on the output signal, and improve the output effect of the shift register.

In addition, an embodiment of the present disclosure provides a gate driving circuit comprising a plurality of shift registers connected in cascade described in the above.

An embodiment of the present disclosure also provides a display apparatus comprising a gate driving circuit described in the above.

According to another aspect, an embodiment of the present disclosure also provides a driving method for a shift register, comprising:

controlling a signal transmission between a start signal input terminal and a first node by an input module;

controlling an output module by an output control module; and controlling a signal output at a signal output terminal by the output module, wherein the output control module comprises a first control unit and a second control unit, and the output module comprises a first output unit and a second output unit; the level at the first node is controlled by the first control unit, and the first output unit is controlled by the level at the first node; the level at a second node is controlled by the second control unit, and the second output unit is controlled by the level at the second node.

Optionally, in the driving method, wherein during a first period, a second clock signal input from a second clock signal input terminal and a third clock signal input from a third clock signal input terminal are at a high level, a start signal input from the start signal input terminal and a first clock signal input from a first clock signal input terminal are at a low level;

the start signal is transmitted to the first node, the first node is at the low level, and the second clock signal is transmitted to the signal output terminal;

the start signal is transmitted to the second node, the second node is at the low level, and the high level signal from the high level signal input terminal is transmitted to the signal output terminal;

during a second period, the start signal input from the start signal input terminal, the first clock signal input from the first clock signal input terminal and the third clock signal input from the third clock signal input terminal are at the high level, and the second clock signal input from the second clock signal input terminal is at the low level;

the second clock signal is transmitted to the signal output terminal;

the start signal is transmitted to the second node, and the high level signal is transmitted to the signal output terminal;

during a third period, the start signal input from the start signal input terminal, the first clock signal input from the first clock signal input terminal and the second clock signal input from the second clock signal input terminal are at the high level, and the third clock signal input from the third clock signal input terminal is at the low level;

the high level signal is transmitted to the first node, the first node is at the high level; the low level signal is transmitted to the second node, and the high level signal is transmitted to the signal output terminal;

during a fourth period, the start signal input from the start signal input terminal, the second clock signal input from the second clock signal input terminal and the third clock signal input from the third clock signal input terminal are at the high level, and the first clock signal input from the first clock signal input terminal is at the low level;

the start signal is transmitted to the first node, the first node is at the high level, and the high level signal is transmitted to the signal output terminal;

during a fifth period, the start signal input from the start signal input terminal, the first clock signal input from the first clock signal input terminal and the third clock signal input from the third clock signal input terminal are at the high level, and the second clock signal input from the second clock signal input terminal is at the low level;

the high level signal is transmitted to the first node, and the first node is at the high level;

the high level is transmitted to the signal output terminal;

during a sixth period, the start signal input from the start signal input terminal, the first clock signal input from the first clock signal input terminal and the second clock signal input from the second clock signal input terminal are at the high level, and the third clock signal input from the third clock signal input terminal is at the low level;

the high level signal is transmitted to the first node, and the first node is at the high level;

the low level is transmitted to the second node, and the high level signal is transmitted to the signal output terminal.

Optionally, in the driving method, during a first period, a second clock signal input from a second clock signal input terminal and a third clock signal input from a third clock signal input terminal are at a low level, a start signal input from the start signal input terminal and a first clock signal input from a first clock signal input terminal are at a high level;

the start signal is transmitted to the first node, the first node is at the high level, and the second clock signal is transmitted to the signal output terminal;

the start signal is transmitted to the second node, the second node is at the high level, and the low level signal is transmitted to the signal output terminal;

during a second period, the start signal input from the start signal input terminal, the first clock signal input from the first clock signal input terminal and the third clock signal input from the third clock signal input terminal are at the low level, and the second clock signal input from the second clock signal input terminal is at the high level;

the second clock signal is transmitted to the signal output terminal;

the start signal is transmitted to the second node, and the low level signal is transmitted to the signal output terminal;

during a third period, the start signal input from the start signal input terminal, the first clock signal input from the first clock signal input terminal and the second clock signal input from the second clock signal input terminal are at the low level, and the third clock signal input from the third clock signal input terminal is at the high level;

the low level signal is transmitted to the first node, and the first node is at the low level; the high level signal is transmitted to the second node, and the low level signal is transmitted to the signal output terminal;

during a fourth period, the start signal input from the start signal input terminal, the second clock signal input from the second clock signal input terminal and the third clock signal input from the third clock signal input terminal are at the low level, and the first clock signal input from the first clock signal input terminal is at the high level;

the start signal is transmitted to the first node, and the first node is at the low level;

the low level signal is transmitted to the signal output terminal;

during a fifth period, the start signal input from the start signal input terminal, the first clock signal input from the first clock signal input terminal and the third clock signal input from the third clock signal input terminal are at the low level, and the second clock signal input from the second clock signal input terminal is at the high level;

the low level signal is transmitted to the first node, and the first node is at the low level;

the low level is transmitted to the signal output terminal;

during a sixth period, the start signal input from the start signal input terminal, the first clock signal input from the first clock signal input terminal and the second clock signal input from the second clock signal input terminal are at the low level, and the third clock signal input from the third clock signal input terminal is at the high level;

the low level signal is transmitted to the first node;

the high level is transmitted to the second node, and the low level signal is transmitted to the signal output terminal.

An embodiment of the present disclosure provides a driving method for a shift register. The driving method comprises: controlling a signal transmission between a start signal input terminal and a first node by an input module; controlling a signal output at a signal output terminal by an output module; and controlling the output module by an output control module; wherein the output control module comprises a first control unit and a second control unit, and the output module comprises a first output unit and a second output unit; wherein the level at the first node is controlled by the first control unit, and the first output unit is controlled by the first node; the level at a second node is controlled by the second control unit, and the second output unit is controlled by the second node. Therefore, it is possible to stabilize the levels at the first node and the second node, diminish the influence of the change of the clock signal associated with the output module on the output signal, and improve the output effect of the shift register.

BRIEF DESCRIPTION OF THE DRAWINGS

In order to describe the technical solutions in embodiments of the present disclosure and the known technical solutions clearly, the figures needing to be used in the description will be briefly introduced in the following. Obviously, the figures in the following description only illustrate some embodiments of the present disclosure. Those skilled in the art can obtain other figures based on those figures without paying any creative work.

REFERENCE SIGNS

1—input module; 2—output module; 21—first input unit; 22—second output unit;
3—output control module; 31—first control unit; 32—second control unit

DETAILED DESCRIPTION

In the following, a clear and complete description will be made on technical solutions in embodiments of the present disclosure in combination with the figures. Obviously, the described embodiments are only a part of the embodiments of the present disclosure, rather than all the embodiments. All other embodiments obtained by those skilled in the art based on the embodiments of the present disclosure without paying any creative work all fall within the scope of the present disclosure.

First Embodiment

Figure 1:
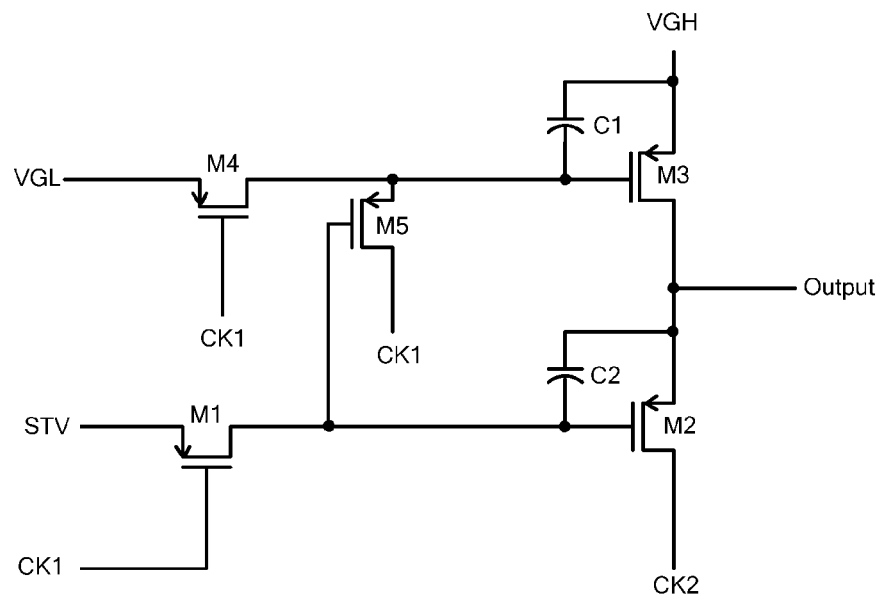
FIG. 1 is a schematic circuit diagram of a known shift register.
Figure 2:
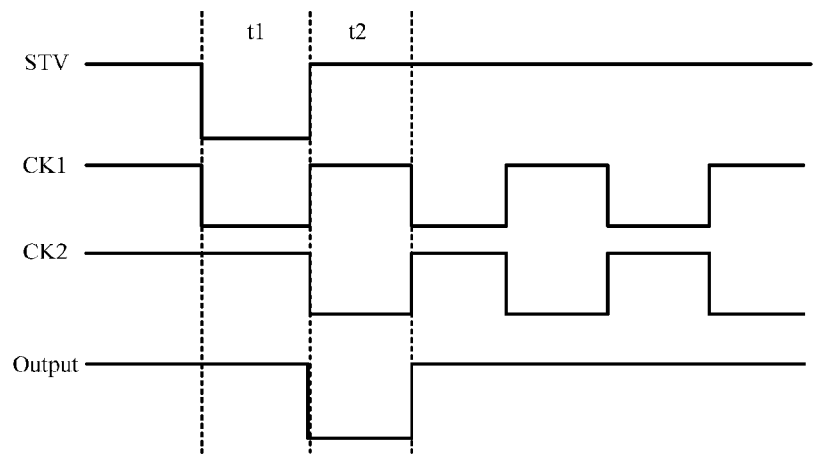
FIG. 2 is a timing sequence diagram of a known shift register in a driving process.
Figure 3:
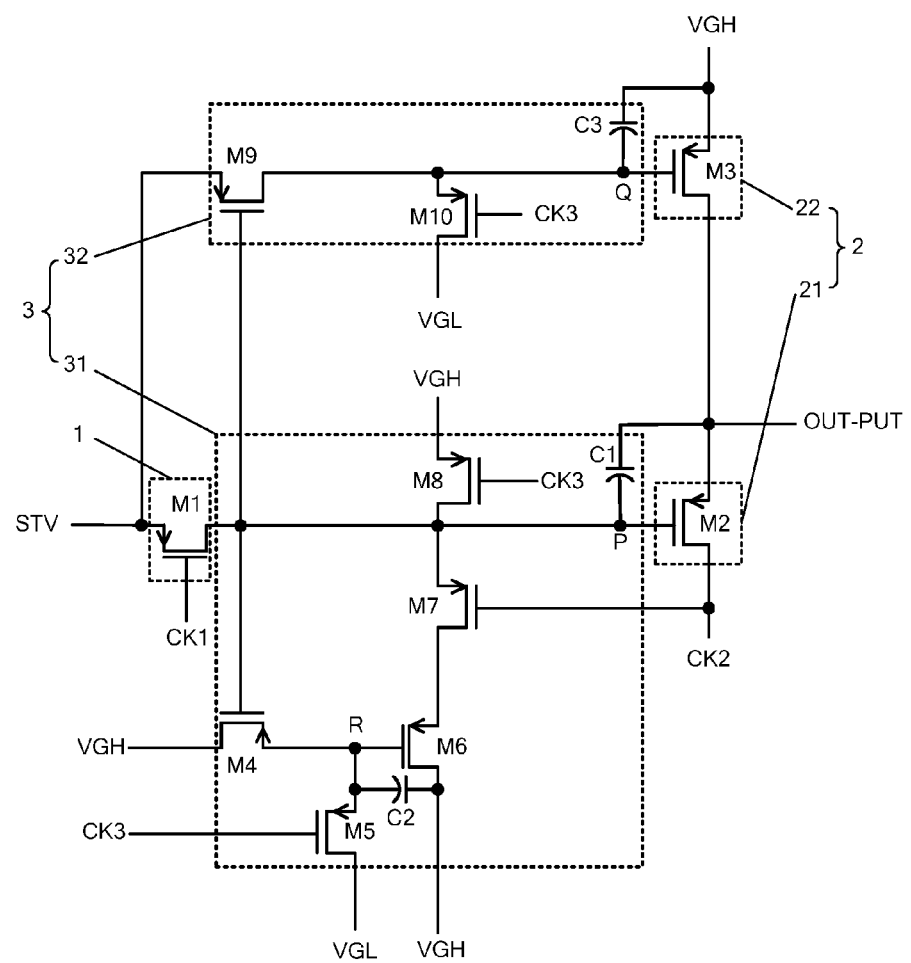
FIG. 3 is a schematic circuit diagram of a first shift register provided by an embodiment of the present disclosure.
Figure 4:
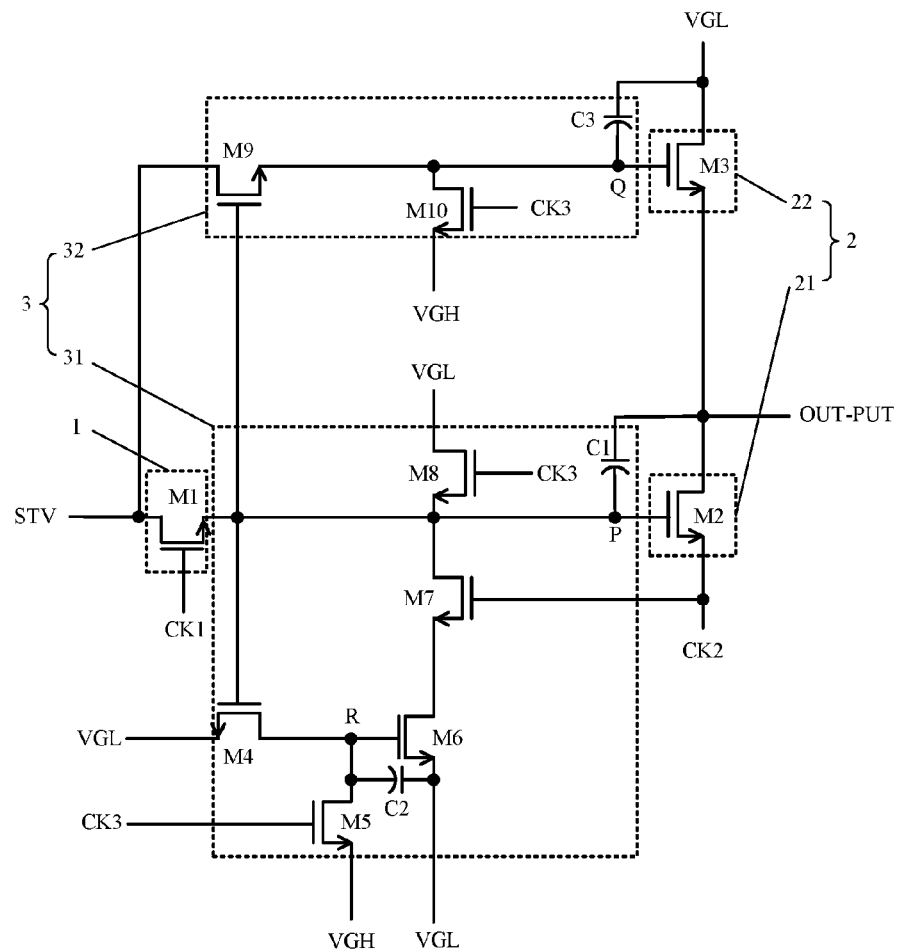
FIG. 4 is a schematic circuit diagram of a second shift register provided by an embodiment of the present disclosure.

An embodiment of the present disclosure provides a shift register, as illustrated in FIG. 3 and FIG. 4. The shift register comprises an input module 1, an output module 2 and an output control module 3.

In particular, the input module 1 controls a signal transmission between a start signal input terminal STV and a first node P.

The output module 2 controls a signal output of a signal output terminal OUTPUT, and comprises a first output unit 21 and a second output unit 22, wherein the first output unit 21 is connected to the first node P which is configured to control the first output unit 21, and the first output unit 21 controls a signal transmission between a second clock signal input terminal CK2 and the signal output terminal OUTPUT; the second output unit 22 is connected to a second node Q which is configured to control the second output unit 22, and the second output unit 22 controls a signal transmission between a high level signal input terminal VGH and the signal output terminal OUTPUT.

The output control module 3 comprises a first control unit 31 and a second control unit 32, wherein the first control unit 31 controls a level at the first node P, and the second control unit 32 controls a level at the second node Q. When the second clock signal input from the second clock signal input terminal CK2 varies between a high level and a low level, the first control unit 31 can stabilize the level at the first node P, so as to reduce the influence of the variation of the second clock signal on the output signal and improve the output effect of the shift register.

In order to facilitating the understanding the embodiments of the present disclosure, the specific structures of the above modules and units are provided in an embodiment of the present disclosure.

Optionally, as illustrated in FIG. 3 and FIG. 4, the input module 1 comprises a first TFT (Thin Film Transistor) M1, which can be a p type TFT or an n type TFT, whose gate is connected to the first clock signal input terminal CK1, whose first electrode is connected to the start signal input terminal STV and whose second electrode is connected to the first node P, such that it is possible to control the turning-on and turning-off of the first TFT M1 by the first clock signal input from the first clock signal input terminal CK1, thus controlling the signal transmission between the start signal input terminal STV and the first node P.

Optionally, as illustrated in FIG. 3 and FIG. 4, the first output unit 21 comprises a second TFT M2, which can be a p type TFT or an n type TFT, whose gate is connected to the first node P, whose first electrode is connected to the signal output terminal OUTPUT and whose second electrode is connected to the second clock signal input terminal CK2, such that it is possible to control the turning-on and turning-off of the second TFT M2 by the level at the first node P, thus controlling the signal transmission between the second clock signal input terminal CK2 and the signal output terminal OUTPUT.

Optionally, as illustrated in FIG. 3 and FIG. 4, the second output unit 22 comprises a third TFT M3. In a case in which the third TFT M3 is a P type TFT, as illustrated in FIG. 3, a gate of the third TFT M3 is connected to the second node Q, a first electrode of the third TFT M3 is connected to the high level signal input terminal VGH, and a second electrode of the third TFT M3 is connected to the signal output terminal OUTPUT, such that it is possible to control the turning-on and turning-off of the third TFT M3 by the level at the second node Q, thus controlling the signal transmission between the high level signal input terminal VGH and the signal output terminal OUTPUT.

In a case in which the third TFT M3 is an n type TFT, as illustrated in FIG. 4, a gate of the third TFT M3 is connected to the second node Q, a first electrode of the third TFT M3 is connected to a low level signal input terminal VGL, and a second electrode of the third TFT M3 is connected to the signal output terminal OUTPUT, such that it is possible to control the turning-on and turning-off of the third TFT M3 by the level at the second node Q, thus controlling the signal transmission between the low level signal input terminal VGL and the signal output terminal OUTPUT.

Optionally, as illustrated in FIG. 3 and FIG. 4, the first control unit 31 comprises a fourth TFT M4, a fifth TFT M5, a sixth TFT M6, a seventh TFT M7, an eighth TFT M8, a first capacitor C1 and a second capacitor C2.

In a case in which the fourth to eighth TFTs are all P type TFTs, as illustrated in FIG. 3, a gate of the fourth TFT M4 is connected to the first node P, a first electrode of the fourth TFT M4 is connected to a third node R, and a second electrode of the fourth TFT M4 is connected to the high level signal input terminal VGH, such that it is possible to control the turning-on and turning-off of the fourth TFT M4 by the level at the first node P, thus controlling the signal transmission between the high level signal input terminal VGH and the third node R.

A gate of the fifth TFT M5 is connected to a third clock signal input terminal CK3, a first electrode of the fifth TFT M5 is connected to the third node R, and a second electrode of the fifth TFT M5 is connected to the low level signal input terminal VGL, such that it is possible to control the turning-on and turning-off of the fifth TFT M5 by the third clock signal, thus controlling the signal transmission between the low level signal input terminal VGL and the third node R.

A gate of the sixth TFT M6 is connected to the third node R, a first electrode of the sixth TFT M6 is connected to a second electrode of the seventh TFT M7, and a second electrode of the sixth TFT M6 is connected to the high level signal input terminal VGH, such that it is possible to control the turning-on and turning-off of the sixth TFT M6 by the level at the third node R, thus controlling the signal transmission between the high level signal input terminal VGH and the second electrode of the seventh TFT M7.

A gate of the seventh TFT M7 is connected to the second clock signal input terminal CK2, a first electrode of the seventh TFT M7 is connected to the first node P, and the second electrode of the seventh TFT M7 is connected to the first electrode of the sixth TFT M6, such that it is possible to control the turning-on and turning-off of the seventh TFT M7 by the second clock signal, thus controlling the signal transmission between the first node P and the first electrode of the sixth TFT M6.

A gate of the eighth TFT M8 is connected to the third clock signal input terminal CK3, a first electrode of the eighth TFT M8 is connected to the high level signal input terminal VGH, and a second electrode of the eighth TFT M8 is connected to the first node P, such that it is possible to control the turning-on and turning-off of the eighth TFT M8 by the third clock signal, thus controlling the signal transmission between the high level signal input terminal VGH and the first node P.

One terminal of the first capacitor C1 is connected to the signal output terminal OUTPUT, and the other terminal of the first capacitor C1 is connected to the first node P, such that it is possible to control the level at the first node P by the first capacitor C1.

One terminal of the second capacitor C2 is connected to the third node R, and the other terminal of the second capacitor C2 is connected to the high level signal input terminal VGH, such that it is possible to control the level at the third node R by the second capacitor C2.

In a case in which the fourth to eighth TFTs are all n type TFTs, as illustrated in FIG. 4, a gate of the fourth TFT M4 is connected to the first node P, a first electrode of the fourth TFT M4 is connected to a third node R, and a second electrode of the fourth TFT M4 is connected to the low level signal input terminal VGL, such that it is possible to control the turning-on and turning-off of the fourth TFT M4 by the level at the first node P, thus controlling the signal transmission between the low level signal input terminal VGL and the third node R.

A gate of the fifth TFT M5 is connected to a third clock signal input terminal CK3, a first electrode of the fifth TFT M5 is connected to the third node R, and a second electrode of the fifth TFT M5 is connected to the high level signal input terminal VGH, such that it is possible to control the turning-on and turning-off of the fifth TFT M5 by the third clock signal, thus controlling the signal transmission between the high level signal input terminal VGH and the third node R.

A gate of the sixth TFT M6 is connected to the third node R, a first electrode of the sixth TFT M6 is connected to a second electrode of the seventh TFT M7, and a second electrode of the sixth TFT M6 is connected to the low level signal input terminal VGL, such that it is possible to control the turning-on and turning-off of the sixth TFT M6 by the level at the third node R, thus controlling the signal transmission between the low level signal input terminal VGL and the second electrode of the seventh TFT M7.

A gate of the seventh TFT M7 is connected to the second clock signal input terminal CK2, a first electrode of the seventh TFT M7 is connected to the first node P, and the second electrode of the seventh TFT M7 is connected to the first electrode of the sixth TFT M6, such that it is possible to control the turning-on and turning-off of the seventh TFT M7 by the second clock signal, thus controlling the signal transmission between the first node P and the first electrode of the sixth TFT M6.

A gate of the eighth TFT M8 is connected to the third clock signal input terminal CK3, a first electrode of the eighth TFT M8 is connected to the low level signal input terminal VGL, and a second electrode of the eighth TFT M8 is connected to the first node P, such that it is possible to control the turning-on and turning-off of the eighth TFT M8 by the third clock signal, thus controlling the signal transmission between the low level signal input terminal VGL and the first node P.

One terminal of the first capacitor C1 is connected to the signal output terminal OUTPUT, and the other terminal of the first capacitor C1 is connected to the first node P, such that it is possible to control the level at the first node P by the first capacitor C1.

One terminal of the second capacitor C2 is connected to the third node R, and the other terminal of the second capacitor C2 is connected to the low level signal input terminal VGL, such that it is possible to control the level at the third node R by the second capacitor C2.

Optionally, as illustrated in FIG. 3 and FIG. 4, the second control unit 32 comprises a ninth TFT M9, a tenth TFT M10 and a third capacitor C3.

In a case in which the ninth transistor and the tenth transistor are both p type TFTs, as illustrated in FIG. 3, a gate of the ninth TFT M9 is connected to the first node P, a first electrode of the ninth TFT M9 is connected to the start signal input terminal, and a second electrode of the ninth TFT M9 is connected to the second node Q.

A gate of the tenth TFT M10 is connected to the third clock signal input terminal CK3, a first electrode of the tenth TFT M10 is connected to the second node Q, and a second electrode of the tenth TFT M10 is connected to the low level signal input terminal VGL, such that it is possible to control the turning-on and turning-off of the tenth TFT M10 by the third clock signal, thus controlling the signal transmission between the low level signal input terminal VGL and the second node Q.

One terminal of the third capacitor C3 is connected to the second node Q, and the other terminal of the third capacitor C3 is connected to the high level signal input terminal VGH, such that it is possible to control the level at the second node Q by the third capacitor C3.

In a case in which the ninth transistor and the tenth transistor are both n type TFTs, as illustrated in FIG. 4, a gate of the ninth TFT M9 is connected to the first node P, a first electrode of the ninth TFT M9 is connected to the start signal input terminal STV, and a second electrode of the ninth TFT M9 is connected to the second node Q, such that it is possible to control the turning-on and turning-off of the ninth TFT M9 by the level at the first node P, thus controlling the signal transmission between the start signal input terminal STV and the second node Q.

A gate of the tenth TFT M10 is connected to the third clock signal input terminal CK3, a first electrode of the tenth TFT M10 is connected to the second node Q, and a second electrode of the tenth TFT M10 is connected to the high level signal input terminal VGH, such that it is possible to control the turning-on and turning-off of the tenth TFT M10 by the third clock signal, thus controlling the signal transmission between the high level signal input terminal VGH and the second node Q.

One terminal of the third capacitor C3 is connected to the second node Q, and the other terminal of the third capacitor C3 is connected to the low level signal input terminal VGL, such that it is possible to control the level at the second node Q by the third capacitor C3.

It is noted that all TFTs in the shift register in the embodiment of the present disclosure are all the same type of TFTs. In other words, the first to tenth TFTs in FIG. 3 are all p type TFTs, and the first to tenth TFTs in FIG. 4 are all n type TFTs. In the case of p type TFTs, the first electrode is the source, and the second electrode is the drain. In the case of n type TFTs, the first electrode is the drain and the second electrode is the source.

An embodiment of the present disclosure provides a shift register comprising an input module, an output module and an output control module, wherein the input module controls the signal transmission between a start signal input terminal and a first node, the output module controls the signal output of a signal output terminal; the output module comprises a first output unit and a second output unit, wherein the first output unit is connected to the first node which controls the signal transmission between a second clock signal input terminal and the signal output terminal; the second output unit is connected to a second node which controls the signal transmission between a high (low) level signal input terminal and the signal output terminal; and the output control module comprises a first control unit and a second control unit, wherein the first control unit controls the level at the first node, and the second control unit controls the level at the second node so as to stabilize the levels at the first node and the second node, diminish influence of the variation of the clock signal associated with the output module on the output signal, and improve the output effect of the shift register.

In addition, an embodiment of the present disclosure further provides a gate driving circuit comprising multiple stages of shift registers in cascade connection as described in the above.

An embodiment of the present disclosure further provides a display apparatus comprising a gate driving circuit as described in the above. The display apparatus can be any product or components with a display function, such as a liquid crystal panel, a tablet computer, a television, a display, a notebook computer, an electronic paper, a cell phone, a digital photo frame, a navigator, etc.

Second Embodiment

An embodiment of the present disclosure provides a driving method for the shift register described in the first embodiment. The driving method for the shift register comprises: controlling a signal transmission between a start signal input terminal STV and a first node P by an input module 1; controlling a signal output of a signal output terminal OUTPUT by an output module 2; and controlling the output module 2 by an output control module 3.

The output control module 3 comprises a first control unit 31 and a second control unit 32, and the output module 2 comprises a first output unit 21 and a second output unit 22, wherein the level at the first node P is controlled by the first control unit 31, and the first output unit 21 is controlled by the first node P; the level at a second node Q is controlled by the second control unit 32, and the second output unit 22 is controlled by the second node Q. Therefore, it is possible to stabilize the levels at the first node P and the second node Q, diminish influence of the variation of the clock signal associated with the output module 2 on the output signal, and improve the output effect of the shift register.

Figure 5:
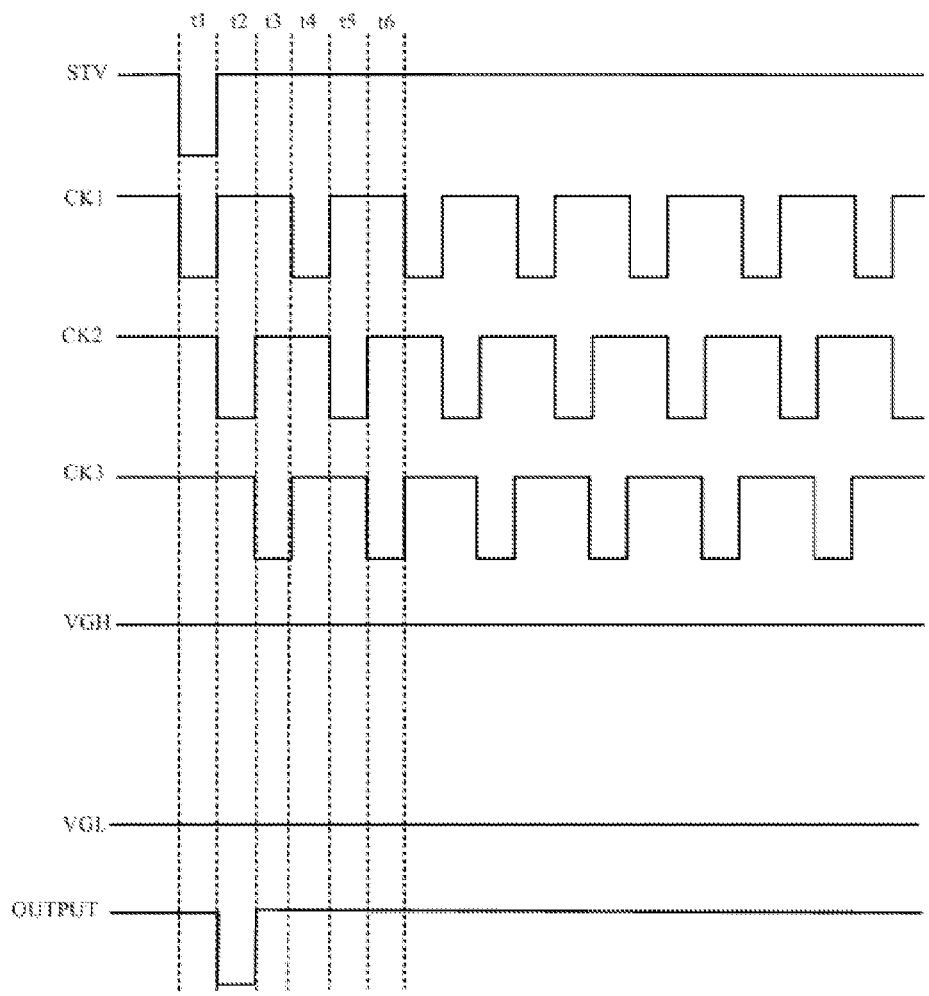
FIG. 5 is a timing sequence diagram of the first shift register, provided by an embodiment of the present disclosure, in a driving process.

In particular, the driving method for the shift register as illustrated in FIG. 3 comprises six periods. The timing sequence of the driving process is as illustrated in FIG. 5. In the embodiment, the first to the tenth TFTs are all p type TFTs, in other words, each of the TFTs is turned on when a low level signal is applied on the gate, and turned off when a high level signal is applied on the gate.

A First Period t1:

As illustrated in FIG. 5, a second clock signal input from a second clock signal input terminal CK2 and a third clock signal input from a third clock signal input terminal CK3 are at a high level, a start signal input from the start signal input terminal STV and a first clock signal input from a first clock signal input terminal CK1 are at a low level.

At this time, the first TFT M1 is turned on, and the start signal is transmitted to the first node P; the eighth TFT M8 is turned off, the first node P is at the low level, the second TFT M2 is turned on, and the second clock signal is transmitted to the signal output terminal OUTPUT and charges the first capacitor C1; the fourth TFT M4 is turned on, the high level signal input from the high level signal input terminal VGH is transmitted to the third node R, so that the third node R is at the high level, the sixth TFT M6 is turned off, and the second capacitor C2 is charged; the fifth TFT M5 is turned off, and the seventh TFT M7 is turned off. Since the sixth TFT M6 and the seventh TFT M7 are both turned off, the high level signal input from the high level signal input terminal VGH cannot be transmitted to the first node P, and thus the signal applied on the gate of the second TFT M2 cannot be affected.

The ninth TFT M9 is turned on, the tenth TFT M10 is turned off, and the start signal is transmitted to the second node Q, so that the second node Q is at the low level, and the third TFT M3 is turned on; the high level signal of the high level signal input terminal VGH is transmitted to the signal output terminal OUTPUT such as to further stabilize the high level signal output on the signal output terminal OUTPUT, and charges the third capacitor C3.

A Second Period t2:

As illustrated in FIG. 5, the start signal input from the start signal input terminal STV, the first clock signal input from the first clock signal input terminal CK1 and the third clock signal input from the third clock signal input terminal CK3 are at the high level, and the second clock signal input from the second clock signal input terminal CK2 is at the low level.

At this point, the first TFT M1 is turned off, the eighth TFT M8 is turned off, and the level at the first node P is further decreased due to the coupling capacitance between the gate and the second electrode of the second TFT M2; the first capacitor C1 is discharged to turn on the second TFT M2, so that the second clock signal is transmitted to the signal output terminal OUTPUT. The fourth TFT M4 is turned on, the high level signal is transmitted to the third node R, and the third node R is at the high level; the second capacitor C2 is discharged to turn off the sixth TFT M6; the fifth TFT M5 is turned off, and the seventh TFT M7 is turned on. Since the sixth TFT M6 is turned off, even if the seventh TFT M7 is turned on, the high level signal input from the high level signal input terminal VGH cannot be transmitted to the first node P, and thus the signal applied on the gate of the second TFT M2 cannot be affected.

The ninth TFT M9 is turned on, the start signal is transmitted to the second node Q; the tenth TFT M10 is turned of; the third capacitor C3 is discharged to turn on the third TFT M3, and the high level signal is transmitted to the signal output terminal OUTPUT.

During the second period, the output signal at the signal output terminal OUTPUT is the sum of the high level signal and the second clock signal. Therefore, the output signal during the second period has a relatively low level.

A Third Period t3:

As illustrated in FIG. 5, the start signal input from the start signal input terminal STV, the first clock signal input from the first clock signal input terminal CK1 and the second clock signal input from the second clock signal input terminal CK2 are at the high level, and the third clock signal input from the third clock signal input terminal CK3 is at the low level.

At this point, the first TFT M1 is turned off, the eighth TFT M8 is turned on, the high level signal is transmitted to the first node P, so that the first node P is at the high level; the second TFT M2 is turned off, and the first capacitor C1 is charged; the fourth TFT M4 is turned off, the fifth TFT M5 is turned on, and the low level signal input from the low level signal input terminal VGL is transmitted to the third node R, so that the third node R is at the low level, and the sixth TFT M6 is turned on, so that the second capacitor C2 is charged; the seventh TFT M7 is turned off. Since the seventh TFT M7 is turned off, even if the sixth TFT M6 is turned on, the high level signal input from the high level signal input terminal VGH cannot be transmitted to the first node P.

The ninth TFT M9 is turned off, the tenth TFT M10 is turned on, and the low level signal is transmitted to the second node Q, so that the third TFT M3 is turned on, the high level signal is transmitted to the signal output terminal OUTPUT and charges the third capacitor C3.

A Fourth Period t4,

As illustrated in FIG. 5, the start signal input from the start signal input terminal STV, the second clock signal input from the second clock signal input terminal CK2 and the third clock signal input from the third clock signal input terminal CK3 are at the high level, and the first clock signal input from the first clock signal input terminal CK1 is at the low level.

At this point, the first TFT M1 is turned on, and the start signal is transmitted to the first node P; the eighth TFT M8 is turned off, and the first node P is at the high level, so that the second TFT M2 is turned off, and the first capacitor C1 is charged; the fourth TFT M4 is turned off, the fifth TFT M5 is turned off, the second capacitor C2 is discharged to turn on the sixth TFT M6; the seventh TFT M7 is turned off. Since the seventh TFT M7 is turned off, even if the TFT M6 is turned on, the high level signal input from the high level signal input terminal VGH cannot be transmitted to the first node P.

The ninth TFT M9 is turned off, the tenth TFT M10 is turned off, and the third capacitor C3 is discharged to turn on the third TFT M3, and the high level signal is transmitted to the signal output terminal OUTPUT.

A Fifth Period t5:

As illustrated in FIG. 5, the start signal input from the start signal input terminal STV, the first clock signal input from the first clock signal input terminal CK1 and the third clock signal input from the third clock signal input terminal CK3 are at the high level, and the second clock signal input from the second clock signal input terminal CK2 is at the low level.

At this point, the first TFT M1 is turned off, and the eight TFT M8 is turned off; the second capacitor C2 is discharged to turn on the sixth TFT M6; the seventh TFT M7 is turned on, the high level signal is transmitted to the first node P, so that the first node P is at the high level, and the second TFT M2 is turned off; the first capacitor C1 is charged, and the fourth TFT M4 is turned off; the fifth TFT M5 is turned off. At this point, since the sixth TFT M6 is turned on, the seventh TFT M7 is turned on, and the high level signal can be transmitted to the first node P to maintain the high level at the first node P, so that when the second clock signal is changed from the high level to the low level, the signal applied on the gate of the second TFT M2 would not be affected by the coupling capacitance between the gate and the second electrode of the second TFT M2.

The ninth TFT M9 is turned off; the tenth TFT M10 is turned off, and the third capacitor C3 is discharged to turn on the third TFT M3, so that the high level is transmitted to the signal output terminal OUTPUT.

A Sixth Period t6:

As illustrated in FIG. 5, the start signal input from the start signal input terminal STV, the first clock signal input from the first clock signal input terminal CK1 and the second clock signal input from the second clock signal input terminal CK2 are at the high level, and the third clock signal input from the third clock signal input terminal CK3 is at the low level.

At this point, the first TFT M1 is turned off, the eight TFT M8 is turned on, and the high level signal is transmitted to the first node P, so that the first node P is at the high level, the second TFT M2 is turned off, and the first capacitor C1 is charged; the fourth TFT M4 is turned off; the fifth TFT M5 is turned on, the low level signal is transmitted to the third node R, so that the third node R is at the low level, the sixth TFT M6 is turned on, and the second capacitor C2 is charged; the seventh TFT M7 is turned off. The purpose of charging the second capacitor C2 is to enable the second capacitor C2 to stably maintain the turning-on of the sixth TFT M6 when a next second clock signal is at the low level such that the sixth TFT M6 and the seventh TFT M7 can be both turned on when the second clock signal is at the low level so as to transmit the high level signal to the first node P, avoiding the signal applied on the gate of the second TFT M2 being affected by the variation of the second clock signal between the high level and the low level, thus stabilizing the turning-off of the second TFT M2, stabilizing the signal output on the signal output terminal OUTPUT, and improving the output effect of the shift register.

The ninth TFT M9 is turned off, the tenth TFT M10 is turned on, and the low level is transmitted to the second node Q, so that the third TFT M3 is turned on, and the high level signal is transmitted to the signal output terminal OUTPUT and charges the third capacitor C3.

It should be noted that, after completing the first to the sixth periods, the shift register will repeat the fourth to the sixth periods until the next start signal input from the start signal input terminal STV is at the low level. Then, the process restarts from the first period.

Figure 6:
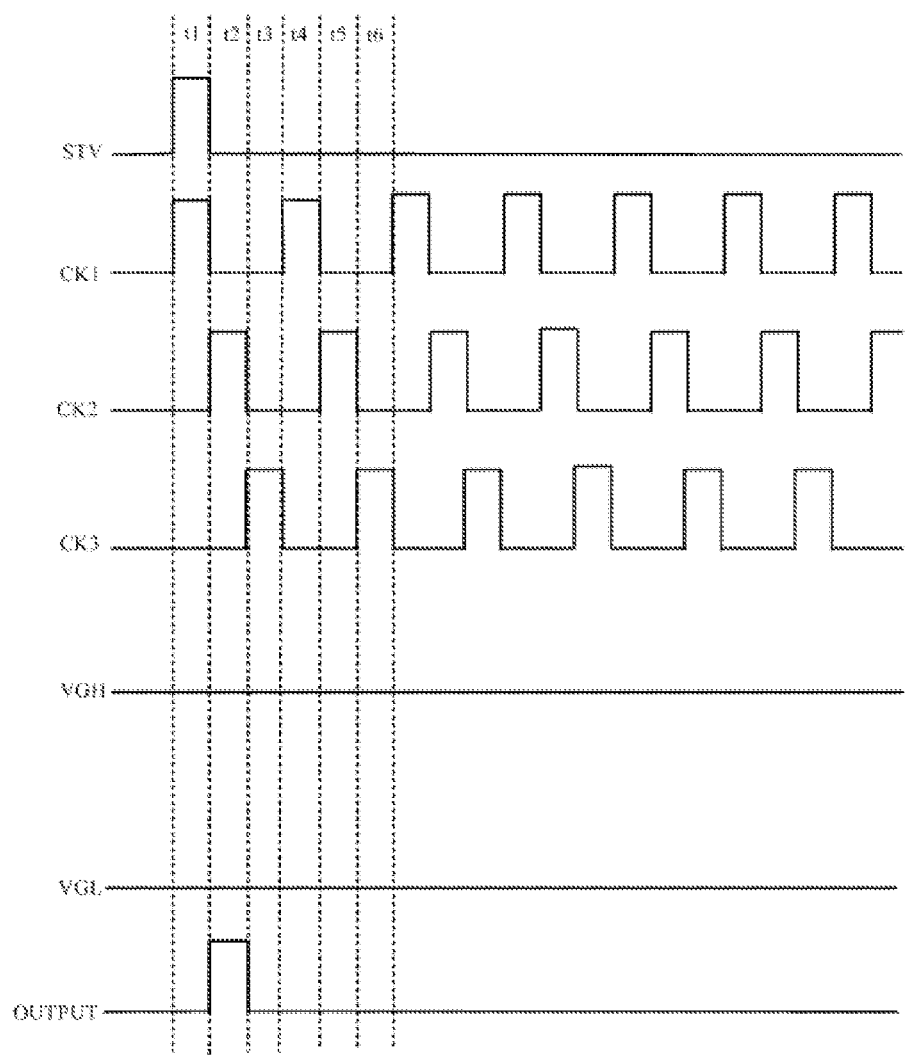
FIG. 6 is a timing sequence diagram of the second shift register, provided by an embodiment of the present disclosure, in a driving process.

In particular, the driving method for the shift register as illustrated in FIG. 4 comprises six periods. The timing sequence diagram of the driving process is as illustrated in FIG. 6. In the embodiment, the first to the tenth TFTs are all n type TFTs, in other words, each of the TFTs is turned on when a high level signal is applied on the gate, and turned off when a low level signal is applied on the gate.

A First Period t1:

As illustrated in FIG. 6, a second clock signal input from a second clock signal input terminal CK2 and a third clock signal input from a third clock signal input terminal CK3 are at a low level, a start signal input from the start signal input terminal STV and a first clock signal input from a first clock signal input terminal CK1 are at a high level.

At this point, the first TFT M1 is turned on, and the start signal is transmitted to the first node P; the eighth TFT M8 is turned off, the first node P is at the high level, and the second TFT M2 is turned on, so that the second clock signal is transmitted to the signal output terminal OUTPUT and charges the first capacitor C1; the fourth TFT M4 is turned on, and the low level signal input from the low level signal input terminal VGL is transmitted to the third node R, so that the third node R is at the low level; the sixth TFT M6 is turned off, and the second capacitor C2 is charged; the fifth TFT M5 is turned off, and the seventh TFT M7 is turned off. Since the sixth TFT M6 and the seventh TFT M7 are both turned off, the low level signal input from the low level signal input terminal VGL cannot be transmitted to the first node P, and thus the signal applied on the gate of the second TFT M2 cannot be affected.

The ninth TFT M9 is turned on, and the tenth TFT M10 is turned off, so that the start signal is transmitted to the second node Q, and the second node Q is at the high level; the third TFT M3 is turned on, and the low level signal from the low level signal input terminal VGL is transmitted to the signal output terminal OUTPUT so as to further stabilize the low level signal output on the signal output terminal OUTPUT and charge the third capacitor C3.

A Second Period t2:

As illustrated in FIG. 6, the start signal input from the start signal input terminal STV, the first clock signal input from the first clock signal input terminal CK1 and the third clock signal input from the third clock signal input terminal CK3 are at the low level, and the second clock signal input from the second clock signal input terminal CK2 is at the high level.

At this point, the first TFT M1 is turned off, and the eighth TFT M8 is turned off; the level at the first node P is further increased due to the coupling capacitance between the gate and the second electrode of the second TFT M2, the first capacitor C1 is discharged to turn on the second TFT M2, and the second clock signal is transmitted to the signal output terminal OUTPUT. The fourth TFT M4 is turned on, and the low level signal is transmitted to the third node R, so that the third node R is at the low level; the second capacitor C2 is discharged to turn off the sixth TFT M6; the fifth TFT M5 is turned off, and the seventh TFT M7 is turned on. Since the sixth TFT M6 is turned off, even if the seventh TFT M7 is turned on, the low level signal input from the low level signal input terminal VGL cannot be transmitted to the first node P, and thus the signal applied on the gate of the second TFT M2 cannot be affected.

The ninth TFT M9 is turned on, and the start signal is transmitted to the second node Q; the tenth TFT M10 is turned off, the third capacitor C3 is discharged to turn on the third TFT M3, and the low level signal is transmitted to the signal output terminal OUTPUT.

During the second period, the output signal of the signal output terminal OUTPUT is the sum of the low level signal and the second clock signal. Therefore, the output signal during the second period has a relatively high level.

A Third Period t3:

As illustrated in FIG. 6, the start signal input from the start signal input terminal STV, the first clock signal input from the first clock signal input terminal CK1 and the second clock signal input from the second clock signal input terminal CK2 are at the low level, and the third clock signal input from the third clock signal input terminal CK3 is at the high level.

At this point, the first TFT M1 is turned off, the eighth TFT M8 is turned on, and the low level signal is transmitted to the first node P, so that the first node P is at the low level, the second TFT M2 is turned off, the first capacitor C1 is charged; the fourth TFT M4 is turned off, the fifth TFT M5 is turned on, and the high level signal input from the high level signal input terminal VGH is transmitted to the third node R, so that the third node is at the high level, and the sixth TFT M6 is turned on; the second capacitor C2 is charged, and the seventh TFT M7 is turned off. Since the seventh TFT M7 is turned off, even if the sixth TFT M6 is turned on, the low level signal input from the low level signal input terminal VGL still cannot be transmitted to the first node P.

The ninth TFT M9 is turned off, the tenth TFT M10 is turned on, and the high level signal is transmitted to the second node Q, so that the third TFT M3 is turned on, and the low level signal is transmitted to the signal output terminal OUTPUT and charges the third capacitor C3.

A Fourth Period t4,

As illustrated in FIG. 6, the start signal input from the start signal input terminal STV, the second clock signal input from the second clock signal input terminal CK2 and the third clock signal input from the third clock signal input terminal CK3 are at the low level, and the first clock signal input from the first clock signal input terminal CK1 is at the high level.

At this point, the first TFT M1 is turned on, and the start signal is transmitted to the first node P; the eighth TFT M8 is turned off, and the first node P is at the low level, so that the second TFT M2 is turned off, and the first capacitor C1 is charged; the fourth TFT M4 is turned off, the fifth TFT M5 is turned off, the second capacitor C2 is discharged to turn on the sixth TFT M6; the seventh TFT M7 is turned off. Since the seventh TFT M7 is turned off, even if the sixth TFT M6 is turned on, the low level signal input from the low level signal input terminal VGL still cannot be transmitted to the first node P.

The ninth TFT M9 is turned off, and the tenth TFT M10 is turned off; the third capacitor C3 is discharged to turn on the third TFT M3, and the low level signal is transmitted to the signal output terminal OUTPUT.

A Fifth Period t5:

As illustrated in FIG. 6, the start signal input from the start signal input terminal STV, the first clock signal input from the first clock signal input terminal CK1 and the third clock signal input from the third clock signal input terminal CK3 are at the low level, and the second clock signal input from the second clock signal input terminal CK2 is at the high level.

At this point, the first TFT M1 is turned off, and the eight TFT M8 is turned off; the second capacitor C2 is discharged to turn on the sixth TFT M6, and the seventh TFT M7 is turned on, so that the low level signal is transmitted to the first node P, and the first node P is at the low level; the second TFT M2 is turned off, and the first capacitor C1 is charged; the fourth TFT M4 is turned off; the fifth TFT M5 is turned off. At this point, since the sixth TFT M6 is turned on, the seventh TFT M7 is turned on, and the low level signal can be transmitted to the first node P to maintain the low level at the first node P, so that when the second clock signal is changed from the low level to the high level, the signal applied on the gate of the second TFT M2 would not be affected by the coupling capacitance between the gate and the second electrode of the second TFT M2.

The ninth TFT M9 is turned off, and the tenth TFT M10 is turned off; the third capacitor C3 is discharged to turn on the third TFT M3, and the low level is transmitted to the signal output terminal OUTPUT.

A Sixth Period t6:

As illustrated in FIG. 6, the start signal input from the start signal input terminal STV, the first clock signal input from the first clock signal input terminal CK1 and the second clock signal input from the second clock signal input terminal CK2 are at the low level, and the third clock signal input from the third clock signal input terminal CK3 is at the high level.

At this point, the first TFT M1 is turned off, the eight TFT M8 is turned on, and the high level signal is transmitted to the first node P so that the first node P is at the low level, and the second TFT M2 is turned off; the first capacitor C1 is charged, and the fourth TFT M4 is turned off; the fifth TFT M5 is turned on, and the high level signal is transmitted to the third node R, so that the third node R is at the high level, and the sixth TFT M6 is turned on; the second capacitor C2 is charged; the seventh TFT M7 is turned off. The purpose of charging the second capacitor C2 is to enable the second capacitor C2 to stably maintain the turning-on of the sixth TFT M6 when a next second clock is at the high level such that the sixth TFT M6 and the seventh TFT M7 can be both turned on when the second clock signal is at the high level so as to transmit the low level signal to the first node P, avoiding the signal applied on the gate of the second TFT M2 being affected by the variation of the second clock signal between the low level and the high level, then stabilizing the turning-off of the second TFT M2, stabilizing the signal output at the signal output terminal OUTPUT, and improving the output effect of the shift register.

The ninth TFT M9 is turned off, the tenth TFT M10 is turned on, and the high level is transmitted to the second node Q, so that the third TFT M3 is turned on, and the low level signal is transmitted to the signal output terminal OUTPUT and charges the third capacitor C3.

It should be noted that, after completing the first to the sixth periods, the shift register will repeat the fourth to the sixth periods until a next start signal input from the start signal input terminal STV is the low level. Then the process restarts from the first period.

An embodiment of the present disclosure provides a driving method for a shift register. The driving method comprises: controlling a signal transmission between a start signal input terminal and a first node by an input module; controlling a signal output at a signal output terminal by an output module; and controlling the output module by an output control module, wherein the output control module comprises a first control unit and a second control unit, and the output module comprises a first output unit and a second output unit; the level of the first node is controlled by the first control unit, and the first output unit is controlled by the first node; the level of a second node is controlled by the second control unit, and the second output unit is controlled by the second node. Therefore, it is possible to stabilize the levels of the first node and the second node, diminish the influence of the change of the clock signal associated with the output module, and improve the output effect of the shift register.

With the description of the above embodiments, those skilled in the art can clearly understand that the embodiments of the present disclosure can be implemented by software in combination with necessary common hardware, or can be implemented by only hardware. In addition, the technical solutions of the present disclosure can be implemented by software products. The computer software product is stored in a readable storage medium, such as a floppy disk, a hard disk drive or an optical disk of a computer. The computer software product comprises several instructions to enable a computing device, which can be a personal computer, a server, or a network device, to perform the method described in each embodiment of the present disclosure.

The above descriptions are only specific embodiments of the present disclosure, but are not intended to limit the scope of the present disclosure. Any modification or replacement that can easily occur to those skilled in the art within the technical scope of the present disclosure should fall within the protection scope of the present disclosure. Therefore, the protection scope of the present disclosure should be defined by the protection scope of the claims.

The present application claims the priority of Chinese Patent Application No. 201510055859.7 filed on Feb. 3, 2015, the entire content of which is incorporated as part of the present disclosure by reference.

What is claimed is:

1. A shift register comprising an input module, an output module and an output control module, wherein
the input module is configured to control a signal transmission between a start signal input terminal and a first node;
the output module is configured to control a signal output at a signal output terminal, wherein the output module comprises a first output unit and a second output unit; the first output unit is connected to the first node, and the first node is configured to control the first output unit; the first output unit is configured to control a signal transmission between a second clock signal input terminal and the signal output terminal; the second output unit is connected to a second node, and the second node is configured to control the second output unit; the second output unit is configured to control a signal transmission between a first level signal input terminal and the signal output terminal; and
the output control module comprises a first control unit and a second control unit; the first control unit is configured to control a level at the first node, and the second control unit is configured to control a level at the second node,
wherein the first control unit comprises a fourth TFT, a fifth TFT, a sixth TFT, a seventh TFT, an eighth TFT, a first capacitor and a second capacitor;
a gate of the fourth TFT is connected to the first node, a first electrode tithe fourth TFT is connected to a third node, and a second electrode of the fourth TFT is connected to the first level signal input terminal;
a gate of the fifth TFT is connected to a third clock signal input terminal, a first electrode of the fifth TFT is connected to the third node, and a second electrode of the fifth TFT is connected to the second level signal input terminal;
a gate of the sixth TFT is connected to the third node, a first electrode of the sixth TFT is connected to a second electrode of the seventh TFT, and a second electrode of the sixth TFT is connected to the first level signal input terminal;
a gate of the seventh TFT is connected to the second clock signal input terminal, a first electrode of the seventh TFT is connected to the first node, and the second electrode of the seventh TFT is connected to the first electrode of the sixth TFT;
a gate of the eighth TFT is connected to the third dock signal input terminal, a first electrode of the eighth TFT is connected to the first level signal input terminal, and a second electrode of the eighth TFT is connected to the first node;
one terminal of the first capacitor is connected to the signal output terminal, and the other terminal of the first capacitor is connected to the first node; and
one terminal of the second capacitor is connected to the third node, and the other terminal of the second capacitor is connected to the first level signal input terminal.

2. The shift register according to claim 1, wherein the input module comprises a first Thin Film Transistor TFT having a gate connected to a first clock signal input terminal, a first electrode connected to the start signal input terminal and a second electrode connected to the first node.

3. The shift register according to claim 1, wherein the first output unit comprises a second TFT having a gate connected to the first node, a first electrode connected to the signal output terminal and a second electrode connected to the second clock signal input terminal.

4. The shift register according to claim 1, wherein the second output unit comprises a third TFT having a gate connected to the second node, a first electrode connected to the first level signal input terminal and a second electrode connected to the signal output terminal.

5. The shift register according to claim 1, wherein the second control unit comprises a ninth TFT, a tenth TFT and a third capacitor;
a gate of the ninth TFT is connected to the first node, a first electrode of the ninth TFT is connected to the start signal input terminal, a second electrode of the ninth TFT is connected to the second node;
a gate of the tenth TFT is connected to a third clock signal input terminal, a first electrode of the tenth TFT is connected to the second node, a second electrode of the tenth TFT is connected to the second level signal input terminal; and
one terminal of the third capacitor is connected to the second node, and the other terminal of the third capacitor is connected to the first level signal input terminal.

6. The shift register according to claim 2, wherein in a case in which respective TFTs are of P type, the first level signal input terminal is configured to input a high level, and the second level signal input terminal is configured to input a low level; the first electrode is a source, and the second electrode is a drain; in a case in which respective TFTs are of N type, the first level signal input terminal is configured to input a low level, and the second level signal input terminal is configured to input a high level; the first electrode is a drain, and the second electrode is a source.

7. A gate driving circuit comprising a plurality of shift registers in cascade connection according to claim 1.

8. A display apparatus comprising a gate driving circuit according to claim 7.

9. A driving method for a shift register according to claim 1, comprising:
controlling a signal transmission between the start signal input terminal and the first node by the input module;
controlling the output module by an output control module; and
controlling a signal output at a signal output terminal by the output module.

10. The driving method for the shift register according to claim 9, comprising:
during a first period,
inputting the second clock signal at a high level from a second clock signal input terminal and a third clock signal at a high level from the third clock signal input terminal respectively, and inputting a start signal at a low level from the start signal input terminal and a first clock signal at a low level from a first clock signal input terminal respectively;
transmitting the start signal to the first node so that the first node is at a low level, and transmitting the second clock signal to the signal output terminal;
transmitting the start signal to the second node so that the second node is at a low level, and transmitting a high level signal from a high level signal input terminal to the signal output terminal;
during a second period,
inputting the start signal input at a high level from the start signal input terminal, the first clock signal at a high level from the first clock signal input terminal and the third clock signal at a high level from the third clock signal input terminal respectively, and inputting the second clock signal at a low level from the second clock signal input terminal;
transmitting the second clock signal to the signal output terminal;
transmitting the start signal to the second node, and transmitting the high level signal to the signal output terminal;
during a third period,
inputting the start signal at a high level from the start signal input terminal, the first clock signal at a high level from the first clock signal input terminal and the second clock signal at a high level from the second clock signal input terminal respectively, and inputting the third clock signal at a low level from the third clock signal input terminal;
transmitting the high level signal to the first node so that the first node is at a high level, transmitting a low level signal from a low level signal input terminal to the second node, and transmitting the high level signal to the signal output terminal;

during a fourth period,
inputting the start signal at a high level from the start signal input terminal, the second clock signal at a high level from the second clock signal input terminal and the third clock signal at a high level from the third clock signal input terminal respectively, and inputting the first clock signal at a low level from the first clock signal input terminal;
transmitting the start signal to the first node so that the first node is at a high level, and transmitting the high level signal to the signal output terminal;
during a fifth period,
inputting the start signal at a high level from the start signal input terminal, the first clock signal at a high level from the first clock signal input terminal and the third clock signal at a high level from the third clock signal input terminal respectively, and inputting the second clock signal at a low level from the second clock signal input terminal;
transmitting the high level signal to the first node so that the first node is at a high level;
transmitting the high level signal to the signal output terminal;
during a sixth period,
inputting the start signal at a high level from the start signal input terminal, the first clock signal at a high level from the first clock signal input terminal and the second clock signal at a high level from the second clock signal input terminal respectively, and inputting the third clock signal at a low level from the third clock signal input terminal;
transmitting the high level signal to the first node so that the first node is at a high level;
transmitting the low level signal to the second node, and transmitting the high level signal to the signal output terminal.

11. The driving method of the shift register according to claim 9, wherein
during a first period,
inputting a second clock signal at a low level from the second clock signal input terminal and a third clock signal at a low level from the third clock signal input terminal respectively, and inputting a start signal at a high level from the start signal input terminal and a first clock signal at a high level from a first clock signal input terminal respectively;
transmitting the start signal to the first node so that the first node is at a high level, and transmitting the second clock signal to the signal output terminal;
transmitting the start signal to the second node so that the second node is at a high level, and transmitting a low level signal from a low level signal input terminal to the signal output terminal;
during a second period,
inputting, the start signal input at a low level from the start signal input terminal, the first clock signal at a low level from the first clock signal input terminal and the third clock signal at a low level from the third clock signal input terminal respectively, and inputting the second clock signal at a high level from the second clock signal input terminal;
transmitting the second clock signal to the signal output terminal;
transmitting the start signal to the second node, and transmitting the low level signal to the signal output terminal;

during a third period,
inputting the start signal at a low level from the start signal input terminal, the first clock signal at a low level from the first clock signal input terminal and the second clock signal at a low level from the second clock signal input terminal respectively, and inputting the third clock signal at a high level from the third clock signal input terminal;
transmitting the low level signal to the first node so that the first node is at a low level, transmitting a high level signal from a high level signal input terminal to the second node, and transmitting the low level signal to the signal output terminal;
during a fourth period,
inputting the start signal at a low level from the start signal input terminal, the second clock signal at a low level from the second clock signal input terminal and the third clock signal at a low level from the third clock signal input terminal respectively, and inputting the first clock signal at a high level from the first clock signal input terminal;
transmitting the start signal to the first node so that the first node is at a low level; and transmitting the low level signal to the signal output terminal;
during a fifth period,
inputting the start signal at a low level from the start signal input terminal, the first clock signal at a low level from the first clock signal input terminal and the third clock signal at a low level from the third clock signal input terminal respectively, and inputting the second clock signal at a high level from the second clock signal input terminal;
transmitting the low level signal to the first node so that the first node is at a low level;
transmitting the low level to the signal output terminal;
during a sixth period,
inputting the start signal at a low level from the start signal input terminal, the first clock signal at a low level from the first clock signal input terminal and the second clock signal at a low level from the second clock signal input terminal respectively, and inputting the third clock signal at a high level from the third clock signal input terminal;
transmitting the low level signal to the first node so that the first node is at a low level;

transmitting the high level signal to the second node, and transmitting the low level signal to the signal output terminal.

12. The gate driving circuit according to claim 7, wherein the input module comprises a first Thin Film Transistor TFT having a gate connected to a first clock signal input terminal, a first, electrode connected to the start signal input terminal and a second electrode connected to the first node.

13. The gate driving circuit according to claim 7, wherein the first output unit comprises a second TFT having a gate connected to the first node, a first electrode connected to the signal output terminal and a second electrode connected to the second clock signal input terminal.

14. The gate driving circuit according to claim 7, wherein the second output unit comprises a third TFT having a gate connected to the second node, a first electrode connected to the first level signal input terminal and a second electrode connected to the signal output terminal.

15. The gate driving circuit according to claim 7, wherein the second control unit comprises a ninth TFT, a tenth TFT and a third capacitor;
a gate of the ninth TFT is connected to the first node, a first electrode of the ninth TFT is connected to the start signal input terminal, a second electrode of the ninth TFT is connected to the second node;
a gate of the tenth TFT is connected to the third clock signal input terminal, a first electrode of the tenth TFT is connected to the second node, a second electrode of the tenth TFT is connected to the second level signal input terminal; and
one terminal of the third capacitor is connected to the second node, and the other terminal of the third capacitor is connected to the first level signal input terminal.

16. The gate driving circuit according to claim 12, wherein in a case in which respective TFTs are of P type, the first level signal input terminal is configured to input a high level, and the second level signal input terminal is configured to input a low level; the first electrode is a source, and the second electrode is a drain; in a case in which respective TFTs are of N type, the first level signal input terminal is configured to input a low level, and the second level signal input terminal is configured to input a high level; the first electrode, is a drain, and the second electrode is a source.

* * * * *